United States Patent
Wostyn et al.

(10) Patent No.: US 10,269,929 B2
(45) Date of Patent: Apr. 23, 2019

(54) INTERNAL SPACER FORMATION FOR NANOWIRE SEMICONDUCTOR DEVICES

(71) Applicant: IMEC VZW, Leuven (BE)

(72) Inventors: Kurt Wostyn, Lubbeek (BE); Liesbeth Witters, Lubbeek (BE); Hans Mertens, Leuven (BE)

(73) Assignee: IMEC VZW, Leuven (BE)

( * ) Notice: Subject to any disclaimer, the term of this patent is extended or adjusted under 35 U.S.C. 154(b) by 18 days.

(21) Appl. No.: 15/822,497

(22) Filed: Nov. 27, 2017

(65) Prior Publication Data

US 2018/0166558 A1   Jun. 14, 2018

(30) Foreign Application Priority Data

Dec. 9, 2016   (EP) .................... 16203209

(51) Int. Cl.
*H01L 29/66*   (2006.01)
*H01L 29/06*   (2006.01)
(Continued)

(52) U.S. Cl.
CPC ........ *H01L 29/66553* (2013.01); *B82Y 10/00* (2013.01); *H01L 21/02236* (2013.01); *H01L 21/31111* (2013.01); *H01L 29/0673* (2013.01); *H01L 29/0847* (2013.01); *H01L 29/16* (2013.01); *H01L 29/41725* (2013.01); *H01L 29/42392* (2013.01); *H01L 29/66439* (2013.01); *H01L 29/66545* (2013.01); *H01L 29/66742* (2013.01); *H01L 29/775* (2013.01); *H01L 29/78696* (2013.01)

(58) Field of Classification Search
CPC ..... H01L 21/823821; H01L 21/823431; H01L 21/845; H01L 27/10879; H01L 29/66795–29/66818
See application file for complete search history.

(56) References Cited

U.S. PATENT DOCUMENTS 9,087,863 B2   7/2015   Cea et al.
9,219,154 B1   12/2015   Cheng et al.
(Continued)

FOREIGN PATENT DOCUMENTS

| CN | 105518840 A | 4/2016 |
|---|---|---|
| WO | 2015/050546 A1 | 4/2015 |
| WO | 2015/147792 A1 | 10/2015 |

*Primary Examiner* — Angel Roman
(74) *Attorney, Agent, or Firm* — McDonnell Boehnen Hulbert & Berghoff LLP

(57) ABSTRACT

The present disclosure relates to a method of forming an internal spacer between nanowires in a semiconductor device. The method includes providing a semiconductor structure comprising at least one fin. The at least one fin is comprised of a stack of layers of sacrificial material alternated with layers of nanowire material. The semiconductor structure is comprised of a dummy gate which partly covers the stack of layers of the at least one fin. The method also includes removing at least the sacrificial material next to the dummy gate and oxidizing the sacrificial material and the nanowire material next to the dummy gate. This removal results, respectively, in a spacer oxide and in a nanowire oxide. Additionally, the method includes removing the nanowire oxide until at least a part of the spacer oxide is remaining, wherein the remaining spacer oxide is the internal spacer.

14 Claims, 2 Drawing Sheets

(51) Int. Cl.
  *H01L 21/02*      (2006.01)
  *H01L 21/311*     (2006.01)
  *H01L 29/423*     (2006.01)
  *H01L 29/08*      (2006.01)
  *H01L 29/16*      (2006.01)
  *B82Y 10/00*      (2011.01)
  *H01L 29/417*     (2006.01)
  *H01L 29/775*     (2006.01)
  *H01L 29/786*     (2006.01)

(56) References Cited

U.S. PATENT DOCUMENTS

| | | | |
|---|---|---|---|
| 9,899,398 B1* | 2/2018 | Colinge | H01L 27/11551 |
| 2015/0021697 A1* | 1/2015 | Colinge | H01L 29/7848 |
| | | | 257/368 |
| 2015/0090958 A1 | 4/2015 | Yang et al. | |
| 2016/0086796 A1 | 3/2016 | Chan et al. | |
| 2017/0133459 A1* | 5/2017 | Pranatharthiharan | H01L 29/0649 |
| 2017/0194213 A1* | 7/2017 | Ching | H01L 21/823821 |
| 2017/0194480 A1* | 7/2017 | Chen | H01L 29/785 |
| 2018/0033797 A1* | 2/2018 | Colinge | H01L 27/11551 |

\* cited by examiner

INTERNAL SPACER FORMATION FOR NANOWIRE SEMICONDUCTOR DEVICES

CROSS-REFERENCE TO RELATED APPLICATIONS

The present application is a non-provisional patent application claiming priority to EP 16203209.8, filed on Dec. 9, 2016, the contents of which are hereby incorporated by reference.

FIELD OF THE DISCLOSURE

The present disclosure generally relates to the field of nanowire semiconductor devices. More specifically, it relates to a method for forming an internal spacer between nanowires in a semiconductor device.

BACKGROUND

Unless otherwise indicated herein, the materials described in this section are not prior art to the claims in this application and are not admitted to be prior art by inclusion in this section.

The formation of stacked nanowires is an important step for decreasing the feature sizes of semiconductor devices.

One important issue is to reduce the parasitic capacitance due to overlap between the gate and source-drain region of a transistor.

In order to minimize this parasitic capacitance, the formation of an internal spacer has to be an integral part of the nanowire integration scheme.

Forming the internal spacer, however, may be process and/or material intensive. There is therefore room for improvement in the methods for forming the internal spacers.

SUMMARY

The specification and drawings disclose embodiments that relate to forming an internal spacer between nanowires in a semiconductor device.

The above objective is accomplished by a method and device according to the present disclosure.

The present disclosure describes a method of forming an internal spacer between nanowires in a semiconductor device. Such a method may include providing a semiconductor structure comprising at least one fin, the at least one fin comprising a stack of layers of sacrificial material alternated with layers of nanowire material, the semiconductor structure comprising a dummy gate partly covering the stack of layers of the at least one fin, at least removing the sacrificial material next to the dummy gate, oxidizing the sacrificial material and the nanowire material next to the dummy gate, resulting respectively in a spacer oxide and in a nanowire oxide, and removing the nanowire oxide, up to the moment that the nanowire oxide is completely removed and at least a part of the spacer oxide is remaining, wherein the remaining spacer oxide is the internal spacer.

Some embodiments may allow, by first doing an oxidation step, nanowire oxides and spacer oxides to be created. In embodiments of the present disclosure oxides are formed with different material properties. In an example embodiment the difference in material properties of the nanowire oxide and the spacer oxide may be exploited to selectively remove the nanowire oxide and the spacer oxide. In embodiments of the present disclosure the nanowire oxide is removed at a higher rate than the spacer oxide. Some embodiments may include the remaining spacer oxide as an internal spacer.

Some embodiments may allow for no additional material to be added to form the internal spacer. The internal spacer is thereby present at an extremity of the nanowire material. In an example embodiment the integration scheme for the fabrication of an internal spacer for gate-all-around transistors is simplified. In an example embodiment the parasitic capacitance between the source/drain region and the gate is reduced by providing the internal spacer. The transistors can for example be Ge transistors or Si transistors.

Some embodiments may include the formation of the internal spacer which may be implemented during the source/drain formation process as well as during the replacement metal gate (RMG) process. In embodiments of the present disclosure the sacrificial material around the nanowire and the nanowire material are selectively oxidized, wherein the growth rate of the nanowire oxide is limited compared to the growth rate of the spacer oxide. In an example embodiment the thickness of the resulting nanowire oxide is smaller than the thickness of the spacer oxide because of the selective oxidation. This implies that during the removal of the nanowire oxide less nanowire oxide is to be removed and hence also less of the spacer oxide will be removed.

Some embodiments, by forming the internal spacer prior to the nanowire release, may include the internal spacer that can actually serve as a lateral stopping layer for the wire release etch thus providing a method to control the final replacement metal gate critical dimension in contact with the channel material.

In embodiments of the present disclosure the method comprises a step for removing the nanowire material next to the dummy gate thus forming a trench, and this before oxidizing the sacrificial material and the nanowire material.

In embodiments of the present disclosure providing a semiconductor structure comprises providing a semiconductor structure wherein the nanowire material is Ge and the sacrificial layer material is SiGe.

In embodiments of the present disclosure the oxidation of the SiGe results in a Si-rich SiGe-oxide compared to the SiGe sacrificial layer or in pure $SiO_2$ depending on the Ge concentration of SiGe and on the oxidation conditions. Some embodiments may include the oxide not being water or HCl soluble. In embodiments of the present disclosure the Ge nanowire material oxidizes into Ge-oxide. In an example embodiment the oxide may be water or HCl soluble. Thus selective oxide removal is possible.

In embodiments of the present disclosure providing a semiconductor structure comprises providing a semiconductor structure wherein the Ge content in SiGe is lower than 80%.

Some embodiments may include the Ge content in SiGe being below 80%. In embodiments of the present disclosure the Ge content may for example be between 70 and 75%. By lowering the Ge concentration, also the concentration of germanium oxide in the resulting spacer oxide is lowered. This results in a lower solubility of the spacer oxide and hence a better selectivity when selectively removing the nanowire oxide and the spacer oxide.

In embodiments of the present disclosure removing the nanowire oxide is done using a water-based non-oxidizing solution as etchant.

Some embodiments may allow water to be used as etchant. This may for example be deionized water (DIW). In an example embodiment the HF-free water-based solutions may be used. It not only allows for the formation of the internal spacer but also avoids losses of e.g. STI oxide and spacer. In embodiments of the present disclosure the Ge-oxide may also be removed by HCl.

In embodiments of the present disclosure providing a semiconductor structure comprises providing a semiconductor structure wherein the nanowire material is Si and the sacrificial layer material is SiGe.

In embodiments of the present disclosure removing the nanowire oxide is done using HF as etchant.

In embodiments of the present disclosure the Ge content in the spacer oxide is controlled by tuning parameters of the oxidizing step when oxidizing the sacrificial material and the nanowire material.

Some embodiments, by controlling the Ge content in the SiGe-oxide, may include the solubility of SiGe-oxide (in water) to be controlled. By lowering the Ge content in the SiGe-oxide the solubility of SiGe-oxide (in water) is lowered. In embodiments of the present disclosure the nanowire material is Ge and the sacrificial material is SiGe. In an example embodiment a water-based selective etch is possible without the presence of HF. The selectivity of the oxide removal is improved when using as etching material a water-based non-oxidizing solution. In embodiments of the present disclosure the Ge content of the SiGe-oxide is lower than or equal to the Ge-content in the SiGe layer due to Ge condensation. In case the nanowire material is Ge and the sacrificial layer material is SiGe, the Ge-content in the SiGe-oxide can be reduced by certain oxidation conditions or by applying additional annealing steps after oxidation. In case the nanowire material is Si and the sacrificial layer material is SiGe, the Ge-content in the SiGe-oxide may also be reduced by annealing. This may enhance its resistance to HF-based etching.

In embodiments of the present disclosure the method comprises an anneal step, after oxidizing the sacrificial material and the nanowire material. This anneal step is done for controlling the Ge content in the SiGe-oxide.

Some embodiments may allow, by the anneal step, the Ge-content to be lowered further by conversion of Ge-oxide to Si-oxide. This will mainly occur in the SiGe-oxide where the $GeO_2$ is converted into $SiO_2$ when Si nearby. In an example embodiment, by annealing the solubility of the SiGe-oxide in water can be lowered, thereby increasing the selectivity of the oxide removal.

Some embodiments of the present disclosure may include the accompanying independent and dependent claims. Features from the dependent claims may be combined with features of the independent claims and with features of other dependent claims and not merely as explicitly set out in the claims.

These and other aspects of the present disclosure will be apparent from and elucidated with reference to the embodiment(s) described hereinafter.

BRIEF DESCRIPTION OF THE FIGURES

The above, as well as additional, features will be better understood through the following illustrative and non-limiting detailed description of example embodiments, with reference to the appended drawings.

Figure 1:
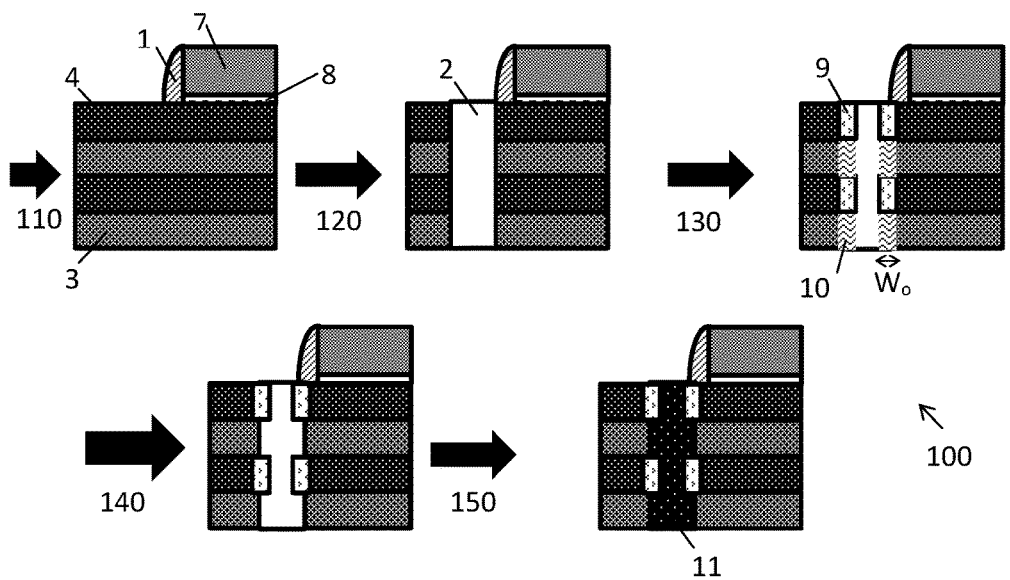
FIG. 1 illustrates the formation of an internal spacer for Ge nanowires with embedded S/D, according to an example embodiment.

Any reference signs in the claims shall not be construed as limiting the scope.

In the different drawings, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the present disclosure.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the present disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the present disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of the example embodiments of the present disclosure, various features are sometimes grouped together in a single embodiment, figure, or description thereof for the purpose of streamlining the disclosure and aiding in the understanding of one or more various aspects. This method of disclosure, however, is not to be interpreted as reflecting an intention that the claimed present disclosure requires more features than are expressly recited in each claim. Rather, as the following claims reflect, various aspects lie in less than all features of a single foregoing disclosed embodiment. Thus, the claims following the detailed description are hereby expressly incorporated into this detailed description, with each claim standing on its own as a separate embodiment of this present disclosure.

Furthermore, while some embodiments described herein include some but not other features included in other embodiments, combinations of features of different embodiments are meant to be within the scope of the present disclosure, and form different embodiments, as would be understood by those in the art. For example, in the following claims, any of the claimed embodiments can be used in any combination.

In the description provided herein, numerous specific details are set forth. However, it is understood that embodiments of the present disclosure may be practiced without these specific details. In other instances, well-known methods, structures and techniques have not been shown in detail in order not to obscure an understanding of this description.

Where in embodiments of the present disclosure reference is made to selective oxidation, reference is made to oxidation wherein there is a difference in oxidation rate between the sacrificial material and the nanowire material.

Where in embodiments of the present disclosure reference is made to selective removal, reference is made to removal of the oxide wherein there is a difference in removal rate between the spacer oxide and the nanowire oxide.

Where in embodiments of the present disclosure reference is made to the nanowire material, reference is made to material from which the nanowires are made.

Embodiments of the present disclosure relate to a method 100 of forming an internal spacer between nanowires in a semiconductor device. The method 100 comprises providing 110 a semiconductor structure comprising at least one fin, the at least one fin comprising a stack of layers of sacrificial material 4 alternated with layers of nanowire material 3, the semiconductor structure comprises a dummy gate 7 partly covering the stack of layers of the at least one fin. The method 100 moreover comprises removing the sacrificial material 4 next to the dummy gate. The method moreover comprises oxidizing 130 the sacrificial material 4 and the nanowire material 3 next to the dummy gate, resulting respectively in a spacer oxide 9 and in a nanowire oxide 10. The method 100 moreover comprises removing 140 the nanowire oxide 10 up to the moment that the nanowire oxide 10 is completely removed and at least part of the spacer oxide is remaining. The spacer oxide 9 may be removed partly or not at all. The remaining spacer oxide 9 is the internal spacer. In embodiments of the present disclosure, after forming the internal spacer, the standard horizontal gate-all-around integration scheme may be continued.

In embodiments of the present disclosure, the oxidation of the sacrificial material 4 is done at a different rate than the oxidation of the nanowire material 3 and/or the removal of the spacer oxide 9 is at a different rate than the removal of the nanowire oxide 10. The oxidation rate of the nanowire material 3 may, for example, be slower than the oxidation rate of the sacrificial material 4. The removal rate of the nanowire oxide 10 may, for example, be faster than the removal rate of the spacer oxide 9. Some embodiments may include selective oxidation, which may provide improved selectivity for subsequent removal (e.g. etching). In embodiments of the present disclosure, the oxidation rates and removal rates are such that when removing the oxides, the nanowire oxide 10 is completely removed before the spacer oxide 9. After complete removal of the nanowire oxide, part of the spacer oxide is remaining. This part is the internal spacer 9. In some embodiments, the spacer oxide may even be completely remaining. In an example embodiment, by oxidation of the sacrificial material and the nanowire material and by selectively removing the nanowire oxide and the spacer oxide, the internal spacer can be formed. In an example embodiment, only a few additional process steps may be taken for internal spacer formation. Some embodiments may allow for no additional material to be added for forming the internal spacer. Example embodiments may be implemented in the S/D (Source/Drain) module or in the RMG module (Replacement Metal Gate).

Some embodiments may include a SiGe—Ge multilayer stack used for the fabrication of Ge nanowires. In that case, the sacrificial material 4 is SiGe, and the nanowire material 3 is Ge. During the oxidation 130 of the SiGe—Ge multilayer stack Ge-oxide is formed on Ge and SiGe-oxide on SiGe. The Ge-oxide, as opposed to Si-oxide, is soluble in water-based solutions, and can be removed selectively to the SiGe-oxide. Some embodiments may allow a difference in solubility in water (or HCl) of the spacer oxide compared to the solubility in water (or HCl) of the nanowire oxide, which enables the internal spacer formation. Because of the difference in solubility, a faster removal rate for the nanowire oxide than for the spacer oxide can be established. In an example embodiment, $GeO_2$ water-based solutions not containing HF can be used. Thereby it is prevented that the etchant removes the SiGe-oxide. In an example embodiment oxidation rate between SiGe and Ge can also be tuned in favor of SiGe. Thus, a higher oxidation rate can be obtained for the sacrificial material than for the nanowire material.

Hence, methods according to the present disclosure may be used for forming Ge horizontal gate-all-around transistors by oxidation of the SiGe—Ge stack in the S/D or RMG module followed by the selective removal of Ge-oxide using water-based non-oxidizing solutions.

In an example embodiment the sacrificial material 4 is SiGe, and the nanowire material 3 is Si. Some embodiments may include, because of the difference in oxidation rate between SiGe and Si, an internal spacer which can be formed after removal of the nanowire oxide. SiGe oxidizes up to several orders of magnitude faster than Si, enabling the growth of a thick oxide on SiGe compared to a thin one on Si. As only a very thin oxide (compared to the thickness of the SiGe oxide) is formed on Si, it is possible to selectively remove the Si-oxide completely without completely removing the oxide on SiGe. The removal can, for example, be done using HF-based aqueous solutions.

In embodiments of the present disclosure where the sacrificial material is SiGe, the Ge content in the spacer oxide is controlled by tuning the parameters of the oxidizing step (e.g. the oxidation speed, the oxidation temperature). Oxidation of the SiGe forms Si-rich SiGe oxide or pure $SiO_2$ depending on the Ge % of SiGe and depending on the oxidation conditions. For optimum selective oxide removal, the Ge content in the SiGe oxide may be relatively low (e.g. lower than 80%). This can be lowered by starting from a lower Ge concentration in the SiGe. By certain selection of the oxidation conditions, the Ge-content of the SiGe oxide is lower than the Ge-content in the SiGe layer due to Ge condensation. Optionally, by the application of an anneal after oxidation, the Ge-content can be lowered further by conversion of Ge-oxide to Si-oxide. This may occur in the SiGe-oxide where the $GeO_2$ is converted into $SiO_2$ when Si is nearby.

FIG. 1 to FIG. 5 illustrate different method steps in accordance with embodiments of the present disclosure. In step 110, a semiconductor stack is provided. FIG. 1 schematically shows the formation of an internal spacer for Ge nanowires with embedded S/D in accordance with embodiments of the present disclosure. In an example embodiment of FIG. 1, the fin comprises a stack of alternating layers of sacrificial material 4 and of nanowire material 3. In an example embodiment, the sacrificial material 4 is SiGe and the nanowire material 3 is Ge. A dummy gate 7 is partly covering the stack of layers of the fin. Next to the dummy gate 7, a dummy spacer 1 is present. Between the dummy gate 7 and the stack of layers of the fin, a dummy dielectric 8 is present. In step 120, the sacrificial material 4 and the nanowire material next to the dummy gate is removed. This may, for example, be done for obtaining an embedded S/D. This can, for example, be done by a recess etch (see, for example, FIG. 1 wherein dry etching may be applied). In step 130, the sacrificial material 4 and the nanowire material 3 next to the dummy gate are oxidized into respectively a spacer oxide 9 ($Si(Ge)O_{x-Ge}$) and a nanowire oxide 10 ($GeO_x$). An example thereof is illustrated in FIG. 1. The width $W_o$ of the formed oxides in this example may be between 5 and 10 nm. In step 140, the nanowire oxide 10 and the spacer oxide 9 are selectively removed up to the moment that the nanowire oxide 10 is completely removed and the spacer oxide 9 is removed partly (or not at all). In such scenarios, the remaining spacer oxide 9 is the internal spacer. In the example of FIG. 1 this may, for example, be done using HCl or DIW rinse. In an example embodiment, the S/D 11 are formed 150 using epitaxial growth. Subsequently, (e.g. in the RMG module) the layers of sacrificial material 4 are removed. In an example embodiment, the removal of the sacrificial layer (e.g. by selective etching) can stop on the internal spacer 9.

Figure 2:
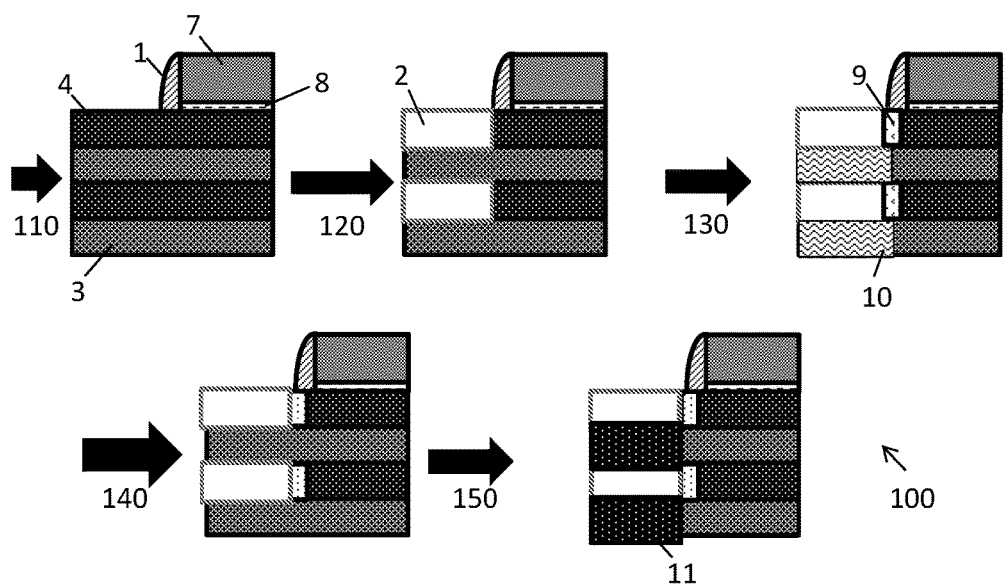
FIG. 2 schematically shows the formation of an internal spacer for Ge nanowires with raised S/D, according to an example embodiment.

FIG. 2 schematically shows the formation of an internal spacer for Ge nanowires with raised S/D in accordance with embodiments of the present disclosure. The provided semiconductor structure is the same as in FIG. 1. During the removal step 120, the sacrificial material next to the dummy gate is removed while the nanowire material is remaining. This may, for example, be done using dry and selective etching. It may, for example, be done using TMAH etching. Selective etching only the sacrificial material next to the dummy gate is done to obtain an internal spacer with raised S/D or for forming an internal spacer in the RMG module. In the oxidation step 130, the nanowire material 3 and the sacrificial material 4 are oxidized. This results in the nanowire oxide 10 and the spacer oxide 9. The selective removal step 140 wherein the nanowire oxide is removed completely and wherein the spacer oxide is partly or even completely remaining is the same as in FIG. 1. Also the S/D 11 formation 150 is the same as in FIG. 2. In this example embodiment a wrap-around S/D is achieved.

Figure 3:
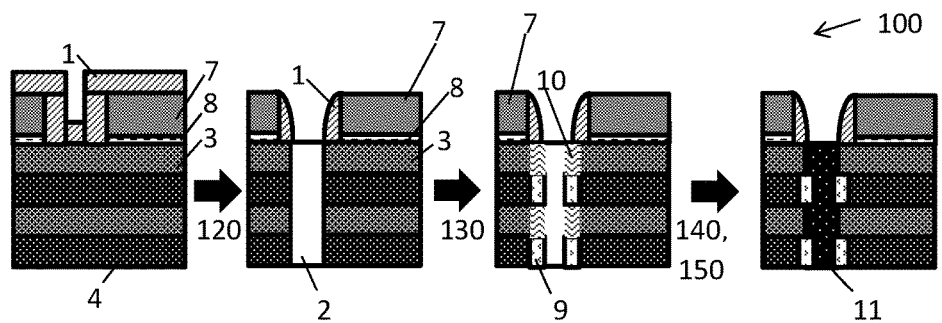
FIG. 3 schematically shows the formation of an internal spacer for nanowires with embedded S/D, according to an example embodiment.

FIG. 3 schematically shows the formation of an internal spacer in a semiconductor structure comprising a fin, which includes an alternating stack of nanowire material 3 and sacrificial material 4, for nanowires with embedded S/D in accordance with embodiments of the present disclosure. A dummy gate 7 is partly covering the stack of layers of the fin. Between the dummy gate 7 and the stack of layers of the fin, a dummy dielectric 8 is present. A spacer 1 is deposited over the dummy gate. In step 120, not only is the sacrificial material next to the dummy gate removed, but a spacer etch and S/D recess are additionally performed. In step 130, the sacrificial material and the nanowire material are oxidized. This may be done at a rate which is different for the sacrificial material than for the nanowire material. In step 140, the nanowire oxide is removed completely. Thereby, part of the spacer oxide may also be removed. The remaining spacer oxide is the internal spacer 9. In step 150, the S/D is formed by epitaxial growth.

Figure 4:
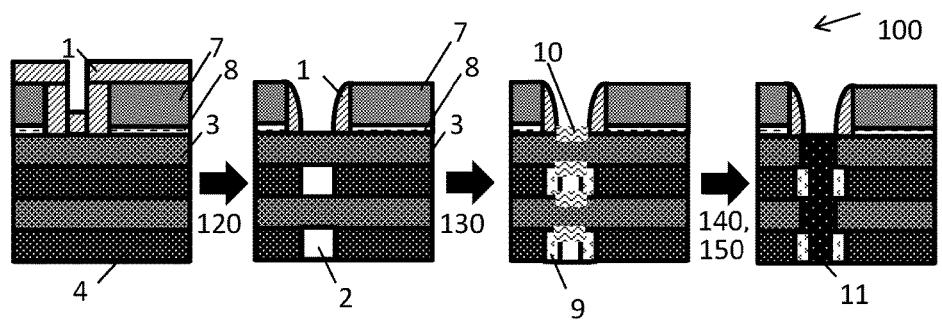
FIG. 4 schematically shows the formation of an internal spacer wherein the spacer is etched and wherein only the sacrificial material next to the dummy gate is removed, according to an example embodiment.
Figure 5:
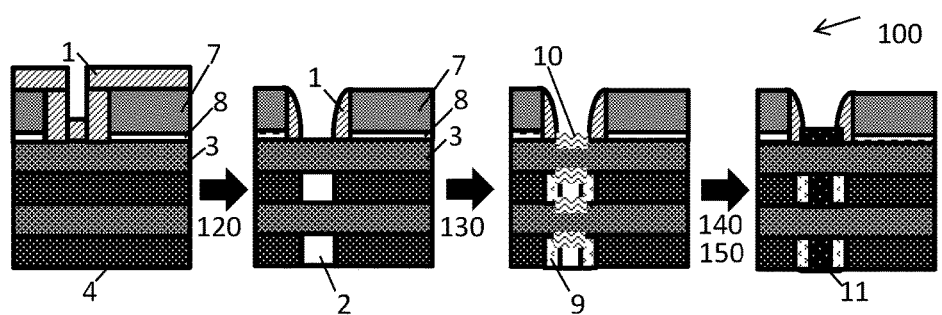
FIG. 5 schematically shows the formation of an internal spacer with recessed S/D, according to an example embodiment.

In FIGS. 1 to 2, the top layer of the layer stack is made of sacrificial material, whereas in FIG. 3 to FIG. 5, the top layer of the layer stack is made of nanowire material.

In embodiments of the present disclosure, the speed at which the nanowire oxide 10 is removed may be different from the speed at which the spacer oxide 9 is removed and/or the oxidation speed of the sacrificial material 4 may be different from the oxidation speed of the nanowire material 3. In embodiments of the present disclosure the oxidation speeds and the removal speeds are such that at the moment the nanowire oxide is removed, the spacer oxide is not completely removed. In embodiments of the present disclosure, the removal of the oxides (e.g. by etching) is timed such that the removal is stopped after the nanowire oxide is completely removed and before the spacer oxide is completely removed. In embodiments of the present disclosure, the spacer oxide is not removed during the oxide removal step.

FIG. 4 schematically shows the formation of an internal spacer 9 wherein the spacer is etched and wherein only the sacrificial material 4 next to the dummy gate 7 is removed, in accordance with embodiments of the present disclosure. This is illustrated in the second drawing of FIG. 4. In this example embodiment, no S/D recess etch is done after the spacer etch. In step 120, a spacer etch is followed by a selective etch, thereby etching only the sacrificial layer. In step 130, the internal spacer is deposited. This is done by oxidizing 130 the sacrificial material and the nanowire material. The nanowire oxide and the nanowire material next to the dummy gate are removed in step 140. In this example, this is done by an S/D recess etch. In this removal step 140, the internal spacer 9 oxide is not removed, or not completely removed. This can be done either by use of a selective approach or by a non-selective approach but taking advantage of anisotropy (since the internal spacer is hidden in between layers of nanowire material. Some embodiments may allow the internal spacer formation to be formed with an unselective, but highly anisotropic S/D recess etch. So the challenge is then changed from selective deposition or removal to the anisotropy of the etch and the absence of selectivity. Next, the S/D is formed using S/D epi.

FIG. 5 schematically shows the formation of an internal spacer with recessed S/D in accordance with embodiments of the present disclosure. The different process steps 120, 130 are the same as in FIG. 4. The difference is in the removal of the nanowire oxide step 140. In FIG. 4, an S/D recess etch is done to remove the nanowire oxide while, at least partly keeping the spacer oxide. In FIG. 5, only the nanowire oxide is removed during the removal step 140. The nanowire itself is still remaining. In case the nanowire material is Ge and the sacrificial material is SiGe, removing 120 the sacrificial material next to the dummy gate can be done by selective etching of the S/D region using a chemical mixture. Oxidizing 130 the sacrificial material 4 (SiGe 50 or 70%) and the nanowire material 3 (Ge) next to the dummy gate can be done using low temperature oxidation. Removing the nanowire oxide completely and keeping at least part of the spacer oxide and at least part of the nanowire material next to the dummy gate can be done using an HCl (aq) rinse.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method comprising:
   providing a semiconductor structure comprising at least one fin, wherein the at least one fin comprises a stack of layers of sacrificial material alternated with layers of nanowire material, wherein the semiconductor structure further comprises a dummy gate, wherein the dummy gate partly covers the stack of layers of the at least one fin;
   removing at least the sacrificial material next to the dummy gate;
   oxidizing the sacrificial material and the nanowire material next to the dummy gate, resulting respectively in a spacer oxide and in a nanowire oxide; and
   removing the nanowire oxide until the nanowire oxide is completely removed and at least a part of the spacer oxide is remaining.

2. The method of claim 1, wherein the remaining spacer oxide comprises an internal spacer, wherein the internal spacer is a space between nanowires in the semiconductor structure.

3. The method of claim 1, further comprising:
   removing the nanowire material next to the dummy gate so as to form a trench; and
   subsequently oxidizing the sacrificial material and the nanowire material.

4. The method of claim 1, further comprising:
   creating a source-drain by epitaxial growth.

5. The method of claim 1, wherein providing a semiconductor structure comprises providing a semiconductor structure wherein the nanowire material is Ge and the sacrificial layer material is SiGe.

6. The method of claim 5, wherein providing a semiconductor structure comprises providing a semiconductor structure wherein a Ge content in SiGe is lower than 80%.

7. The method of claim 5, wherein removing the nanowire oxide is performed using a water-based non-oxidizing solution as an etchant.

8. The method of claim 5, wherein oxidizing the sacrificial material and the nanowire material is performed according to tuning parameters, and wherein the method further comprises:
   while oxidizing the sacrificial material and the nanowire material, adjusting the tuning parameters so as to control a Ge content in the spacer oxide.

9. The method of claim 5, further comprising:
   subsequent to oxidizing the sacrificial material and the nanowire material, annealing the semiconductor structure so as to control a Ge content in an oxidized SiGe layer.

10. The methods of claim 5, wherein oxidizing is performed without water or HCl soluble.

11. The method of claim 5, wherein the nanowire oxide comprises Ge-oxide, wherein removing the Ge-oxide is performed with HCl.

12. The method of claim 1, wherein providing a semiconductor structure comprises providing a semiconductor structure wherein the nanowire material comprises Si and the sacrificial layer material comprises SiGe.

13. The method of claim 12, wherein removing the nanowire oxide is performed using HF as an etchant.

14. The method of claim 12, wherein removing the sacrificial material next to the dummy gate is performed with a water-based selective etch without the presence of HF.

* * * * *